(12) United States Patent
Shin

(10) Patent No.: US 8,084,850 B2
(45) Date of Patent: Dec. 27, 2011

(54) SEMICONDUCTOR CHIP PACKAGE, STACKED PACKAGE COMPRISING SEMICONDUCTOR CHIPS AND METHODS OF FABRICATING CHIP AND STACKED PACKAGES

(75) Inventor: Seung-woo Shin, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 167 days.

(21) Appl. No.: 12/508,609

(22) Filed: Jul. 24, 2009

(65) Prior Publication Data

US 2010/0019368 A1 Jan. 28, 2010

(30) Foreign Application Priority Data

Jul. 25, 2008 (KR) .................. 10-2008-0072951

(51) Int. Cl.
*H01L 23/06* (2006.01)
(52) U.S. Cl. .......... 257/684; 257/E25.027; 257/E23.141
(58) Field of Classification Search .................. 257/686, 257/698, 778, 731, E25.027, E23.011, E23.141, 257/684, 885, 678
See application file for complete search history.

(56) References Cited

U.S. PATENT DOCUMENTS

| | | | |
|---|---|---|---|
| 5,397,917 A * | 3/1995 | Ommen et al. | 257/698 |
| 5,600,541 A * | 2/1997 | Bone et al. | 361/707 |
| 6,084,297 A * | 7/2000 | Brooks et al. | 257/698 |
| 2004/0090756 A1 * | 5/2004 | Ho et al. | 361/767 |
| 2007/0069371 A1 | 3/2007 | Iksan et al. | |

FOREIGN PATENT DOCUMENTS

JP 2004-247706 9/2004
KR 100677184 B1 1/2007

* cited by examiner

*Primary Examiner* — Thomas L Dickey
*Assistant Examiner* — Nikolay Yushin
(74) *Attorney, Agent, or Firm* — Volentine & Whitt, PLLC

(57) ABSTRACT

According to an example embodiment, a semiconductor chip package includes a substrate comprising a substrate body having a first main surface, a second main surface, and a cavity that defines an opening in the first main surface, and a layer of electrically conductive material integral with the substrate body. The layer of electrically conductive material constitutes an interconnection pattern of the substrate. The semiconductor chip packages further includes a semiconductor chip disposed within the cavity and mounted to the substrate. The chip includes electrical contacts in the form of pads and the pads face in a direction towards the bottom of the cavity such that the chip has a flip-chip orientation with respect to the substrate. The pads are electrically conductively bonded to respective portions of the interconnection pattern.

18 Claims, 9 Drawing Sheets

SEMICONDUCTOR CHIP PACKAGE, STACKED PACKAGE COMPRISING SEMICONDUCTOR CHIPS AND METHODS OF FABRICATING CHIP AND STACKED PACKAGES

BACKGROUND OF THE INVENTION

The present invention relates to semiconductor package technology. More particularly, the present invention relates to semiconductor chip packages, stacked packages, and methods of fabricating the same.

Advances in the semiconductor industry have allowed electronic devices such as personal computers, cellular phones and personal multimedia devices to become smaller, lighter and more multi-functional. These advances include the integration of several semiconductor chips into a single package such as a package-on-package (POP) in which a plurality of chip packages are stacked, and chip packages in which a plurality of semiconductor chips are stacked.

Such multi-chip packages are advantageous in terms of their weight and form. However, the integration density of chip packages, including multi-chip packages, has to increase to meet the demand for more miniaturized electronic devices. Likewise, the overall thickness of the package has to be reduced in order to provide a small form factor (SFF). In addition, even miniaturized electronic devices must operate at a high speed and offer high performance. Thus, electrical interconnection structures of semiconductor packages need to be highly reliable if the chips are to operate at high speed.

SUMMARY OF THE INVENTION

One object of the present invention is to provide a semiconductor chip package or a stacked package which is thin and highly reliable.

Likewise, an object of the present invention is to provide a method of fabricating a thin and highly reliable semiconductor package or stacked package.

Still another object of the present invention is to provide a semiconductor chip package or stacked package that is not only thin and highly reliable, but which has a plurality of semiconductor chips and a high degree of integration density.

Likewise, an object of the present invention is to provide a method of fabricating a thin and highly reliable semiconductor package or stacked package which has a plurality of semiconductor chips and a high degree of integration density.

According to an aspect of the present invention, there is provided a semiconductor chip package including a substrate having a substrate body, a cavity open at first main surface of the substrate body, and a patterned layer (at least one) of electrically conductive material constituting an internal interconnection pattern, and a chip mounted within the cavity to the substrate wherein the chip has a flip chip orientation in which contacts of the chip face the bottom of the cavity, and contacts of the chip are electrically conductively bonded to the interconnection pattern. The interconnection may be an internal interconnection pattern forming a layer of contacts within the body of the substrate between the main surfaces thereof or may be an external interconnection pattern that extends along the second main surface of the substrate.

The substrate may have holes extending therethrough between the bottom of the cavity and the interconnection pattern. In this case, electrically conductive vias are disposed in the holes, respectively, and the pads of the semiconductor chip are electrically conductively bonded to the vias, respectively.

According to another aspect of the present invention, there is provided a semiconductor chip package comprising a substrate including a first sub-substrate, a second sub-substrate, and an adhesive interlayer coupling the first and second sub-substrates together, and a first semiconductor chip disposed within a cavity of and mounted to the substrate such that the chip has a flip-chip orientation with respect to the substrate in which electrical contacts of the chip face in a direction towards the bottom of the cavity. The package also has an internal layer of electrically conductive material constituting an internal interconnection pattern of inner contacts, and the contacts of the first chip are electrically conductively bonded to the inner contacts.

The first sub-substrate comprises a substrate body having a first main surface, a second main surface, and a punched out area defining a through-hole extending between and open to the first and second main surfaces. The second sub-substrate comprises a second substrate body having a first main surface facing the second main surface of the body of the first sub-substrate and a second main surface, and a first interconnection pattern. The adhesive interlayer is interposed between the first sub-substrate and the second sub-substrate. The adhesive layer and the punched-out area define the cavity in which the first semiconductor chip is situated. The cavity forms an opening in the first main surface of the first sub-substrate.

The interconnection pattern including inner contacts to which the contacts of the first chip are bonded may be constituted by a layer of electrically conductive material extending along a main surface of the second sub-substrate which faces the first sub-substrate, or may be constituted by a layer of electrically conductive material extending within the adhesive interlayer.

The semiconductor chip package may comprise a second semiconductor chip mounted to the second sub-substrate in a chip attach region of the second sub-substrate. The second semiconductor chip may be oriented with contact pads of the second semiconductor chip directed towards contact pads of the first semiconductor chip. In addition, the contact pads of the second semiconductor chip may be electrically conductively bonded to at least some of the same inner contacts as the pads of the first semiconductor chip.

According to another aspect of the present invention, there is provided a stacked package that comprises a plurality of packages, including at least one of the chip packages described above, stacked one atop the other, and in which electrically conductive bumps electrically connect the packages to one another.

According to another aspect of the present invention, there is provided a method of fabricating a semiconductor chip package which includes providing a substrate having substrate body and an interconnection pattern on a major surface of the substrate body, forming a cavity in the substrate, and mounting a semiconductor chip in a flip chip manner within the cavity to the substrate. The cavity is formed by providing a recess in an upper portion of the body of the substrate. In addition, conductive bumps may be formed on the interconnection pattern.

According to another aspect of the present invention, there is provided another method of fabricating a semiconductor chip package which includes providing a substrate comprising a substrate body and a respective first interconnection pattern formed on each of at least one of the major surfaces of the body and a second interconnection pattern in the substrate body, forming a cavity in an upper portion of the substrate, mounting a semiconductor chip within the cavity in a flip-chip way to the substrate, and forming conductive bumps on the first interconnection pattern.

The cavity is formed by etching, screen printing, or drilling the substrate with a mechanical bit or a laser. In the case in which the substrate has the second interconnection pattern, the recess may be formed such that an upper surface of at least part of the second interconnection pattern is exposed.

After the cavity is formed, holes may be formed in the substrate at the bottom of the cavity to expose at least part of the interconnection pattern. The holes may be formed by a photolithography, etching, screen printing, mechanical drilling or laser drilling process. In this case, via conductors may be formed in the holes as electrically connected to an interconnection pattern of the substrate. Contact pads of the semiconductor chip can be bonded to the via conductors. Alternatively, contact pads of the semiconductor chip can be bonded to an interconnection pattern of the substrate through conductive bumps.

Furthermore, a region in the cavity between the semiconductor chip and a surface of the substrate can be filled with material to protect the electrical connection between the chip and the substrate.

According to another aspect of the present invention, there is provided a method of fabricating a semiconductor chip package which includes providing a first sub-substrate having a punched-out area, providing a second sub-substrate having a first main surface and a second main surface having a first interconnection pattern thereon, coupling the first sub-substrate and the second sub-substrate together with an adhesive interlayer with the first main surface of the second sub-substrate facing the first sub-substrate and the adhesive interlayer interposed between the substrates whereby a cavity is defined by the punched-out area of the first sub-substrate and a surface of the adhesive interlayer, mounting a first semiconductor chip within the cavity in a flip-chip manner to the coupled sub-substrates, and forming conducive bumps on the first interconnection pattern.

The punched-out area of the first sub-substrate may be formed by drilling through the first sub-substrate using a mechanical bit or a laser. For efficiency, the first sub-substrate may be formed by providing a plurality of stacked carrier substrates, drilling through the stack of carrier substrates using a mechanical bit or a laser, and separating the carrier substrates and selecting one of the carrier substrates as the first sub-substrate.

The adhesive interlayer may comprises a prepreg material. In this case, the first sub-substrate and second sub substrate may be coupled together by curing the adhesive layer after the sub-substrates are pressed together with the pre-preg material interposed therebetween. In particular, the sub-substrates are bonded by the pre-preg material during a B-stage and a C-stage of the curing process of the prepreg material.

The second sub-substrate may have a second interconnection pattern on the first surface of the body of the second sub-substrate. In this case, holes exposing at least portions of the second interconnection pattern are formed in the adhesive interlayer after the first sub-substrate and the second sub-substrate are coupled. The holes may be formed by a photolithography, etching, or screen printing process, or by a mechanical or laser drilling process.

Vias are then formed in the holes so as to be electrically connected to the second interconnection pattern. Contact pads of the first semiconductor chip are bonded to the vias. Alternatively, contact pads of the first semiconductor chip can be bonded to the second interconnection pattern through conductive bumps.

The adhesive interlayer comprises first and second insulating layers having adhesive surfaces, respectively, and an interconnection pattern between the first and second insulating layers. At least one of the first and second insulating layers is an anisotropic conductive film (ACF).

A second semiconductor chip can be mounted to the second sub-substrate at a chip attach region thereof. In this case, contact pads of the second semiconductor chip are directed towards the punched-out area of the first sub-substrate. Also, the contact pads of the first and second semiconductor chips are each electrically connected to at least portions of the interconnection pattern of the adhesive interlayer.

To this end, holes exposing portions of the second interconnection pattern of the adhesive interlayer are formed in the first insulating layer after the first sub-substrate and the second sub-substrate are coupled together. Then, vias are formed in the holes as electrically connected to the interconnection pattern of the adhesive interlayer. Contact pads of the first semiconductor chip are bonded to the vias. Alternatively, contact pads of the first semiconductor chip are bonded to interconnection pattern of the adhesive interlayer by conductive bumps.

According to another aspect of the present invention, there is provided a method of fabricating a stacked package which includes: (a) fabricating a first chip package comprising a substrate having a cavity, a substrate body, and first and second interconnection patterns on the first and second main surfaces of the substrate body, respectively, and a first semiconductor chip mounted within the cavity in a flip chip manner to the substrate, (b) providing a second chip package, and (c) stacking the chip packages and at the same time electrically conductively connecting the first and second chip packages through conductive bumps.

These and other objects, features and advantages of the present invention will become clearer from the following detailed description of the preferred embodiments thereof taken in conjunction with the accompanying drawings. However, it should be understood that not all of these objects and advantages are achieved by each embodiment of the present invention. That is, each embodiment may achieve or optimize one advantage or a group of advantages disclosed in this specification without achieving other objects and advantages disclosed in this specification.

DETAILED DESCRIPTION OF THE PREFERRED EMBODIMENTS

Figure 1A:
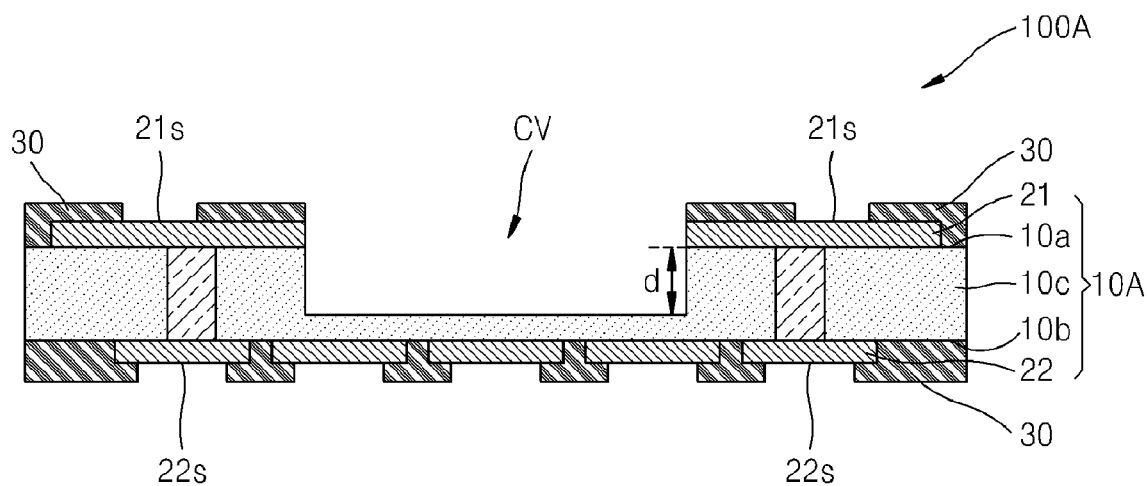
FIG. 1A is a cross-sectional view of a substrate and illustrate one embodiment of a chip package and a method of manufacturing the same according to the present invention.

The present invention will be described more fully hereinafter with reference to the accompanying drawings. As used herein, the term an "interconnection pattern" or a "connection pattern" refers to any electrically conductive feature or set of features formed by a patterning process, such as a conductive trace, lead, land or pad, as are known per se in the art. Also, in the drawings, the shapes, sizes and relative sizes of layers and regions may be exaggerated for clarity. Furthermore, like reference numerals designate like elements throughout the drawings.

A chip package and its method of manufacture, according to the present invention, will now be described with reference to FIGS. 1A through 1D.

Referring to FIG. 1A, the chip package 100A includes a substrate 10A having a first main surface 10a and a second main surface 10b, and a semiconductor chip 50 (FIG. 1D) mounted to the substrate 10A. An interconnection pattern is formed on at least one of the first main surface 10a and the second main surface 10b of the substrate 10A. In the present embodiment, as illustrated in FIG. 1A, first and second interconnection patterns 21 and 22 are formed on the first and second main surfaces 10a and 10b, respectively. The first interconnection pattern 21 and the second interconnection pattern 22 are each formed of, for example, aluminum (Al), copper (Cu), gold (Au), silver (Ag), nickel (Ni) or palladium (Pd), as is well known in the art per se. As a specific example, the substrate 10A comprises a direct bonded copper (DBC) substrate.

The body 10c of the substrate 10A, which electrically insulates the first and second interconnection patterns 21 and 22, may be formed of a resin-based material. More specifically, the body 10c may comprise polymer resin-based material or fiber reinforced plastics such as epoxy resin impregnated glass fiber. Alternatively, the substrate body 10c may be formed of photosensitive liquid dielectrics, photosensitive dry-film dielectrics, polyimide flexible film, thermally cured dry films, thermally cured liquid dielectrics, resin coated copper foil (RCC), thermoplastic or flexible resins. The substrate body 10c may also be formed of ceramic. The above-mentioned materials are exemplary only.

The first interconnection pattern 21 may be electrically connected to a contact of another chip package stacked on the chip package 100A or to a conductive bump such as a solder ball, which will be described later. The second interconnection pattern 22 may constitute contacts that can be electrically connected to an external circuit such as a mother board or another chip package.

A passivation layer 30 exposing regions 21s and 22s of the first and second interconnection patterns 21 and 22, respectively, is formed on each of the first and second main surfaces 10a and 10b of the substrate 10A. For example, the substrate 10A may be coated using a roll laminator to form a dry film resist layer or a dry film solder resistor (DFSR) layer. Alternatively, the substrate 10A may be coated to form a liquid photosensitive solder resist (LPSR) layer. In the case of a resist layer, the layer is cured. Then, the layer is patterned to expose regions 21s and 22s of the first and second interconnection patterns 21 and 22. When the passivation layer 30 is formed of photosensitive resin material, the passivation layer 30 can be patterned using a photolithography process. The exposed regions 21s and 22s of the first and second interconnection patterns 21 and 22 are contacts to which an external circuit is bonded.

A cavity CV for accommodating the semiconductor chip 50 (FIG. 1D) is provided in an upper portion of the substrate 10A and defines an opening in the first main surface 10a. The cavity CV is located at, for example, the central region of the first main surface 10a. The cavity CV may be formed by removing part of the substrate body 10c to a depth d. For example, the substrate body 10c may be dry etched, wet etched, screen-printed, machine drilled or laser drilled to form the cavity CV. Preferably, the substrate body 10c is machine drilled or laser drilled because these processes are relatively simple.

The size and shape of the cavity CV is designed based on the shape, size and type of semiconductor chip 50 to be received therein or in consideration of a process of forming a molded member as will be described later. For example, the profile of the opening defined by the cavity CV in the upper surface 10a may be square or circular and the sidewalls of the body 10a which define the sides of the cavity CV may be perpendicular (vertical) or inclined relative to the upper surface 10a.

Figure 1B:
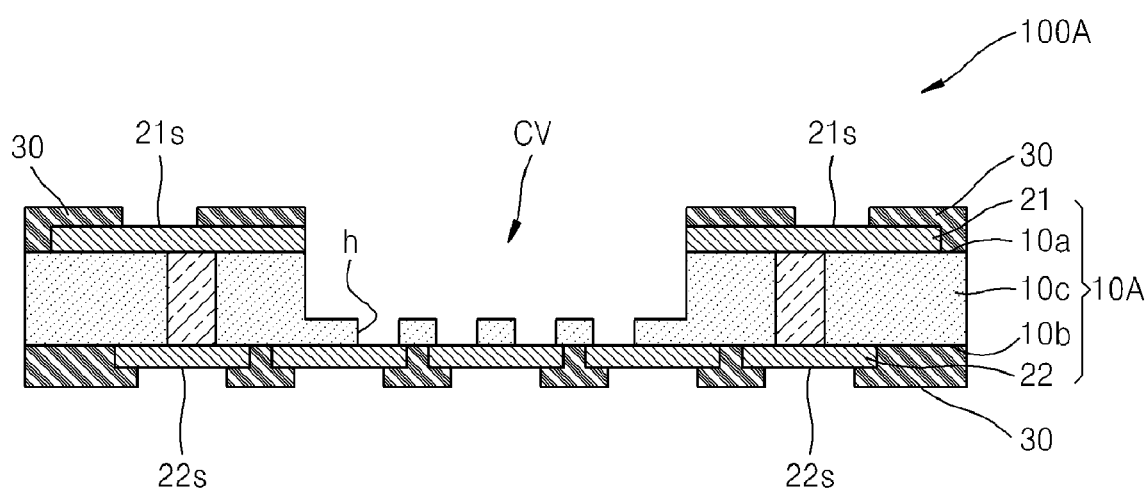
FIG. 1B is a further cross-sectional view of the one embodiment of a chip package and a method of manufacturing the same according to the present invention.

Referring to FIG. 1B, holes h exposing at least a portion of the second interconnection pattern 22 are formed in a bottom portion of the body 10a of the substrate of by a photolithography, wet etching, dry etching, or screen printing process, or preferably by a mechanical or laser drilling process. The holes h extend between and are open to the cavity CV and the interconnection pattern 22.

Figure 1C:
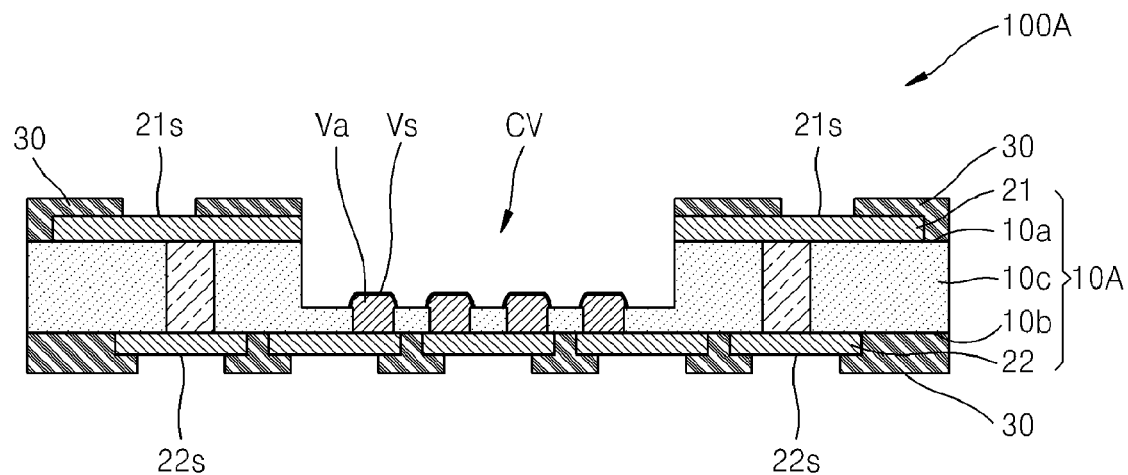
FIG. 1C is a further cross-sectional view of the one embodiment of a chip package and a method of manufacturing the same according to the present invention.

Then, as illustrated in FIG. 1C, via conductors Va are formed in the hole h as electrically connected to the second interconnection pattern 22. The vias (via conductors) Va may be formed of a conductive paste or metal plated onto the second interconnection pattern 22 by electrolysis or electroless plating. The via conductors Va preferably comprise aluminum, copper or an alloy thereof, but the present invention is not limited thereto.

The via conductors Va are thus exposed at the bottom of the cavity CV. A metal layer Vs of, for example, nickel (Ni), tin (Sn), cobalt (Co), gold (Au), silver (Ag) or an alloy thereof may be formed on the via conductors Va to improve mechanical and electrical properties, such as the strength of the bond, between the via conductors Va and contact pads 51 of the semiconductor chip 50 to be received in the cavity CV.

Figure 1D:
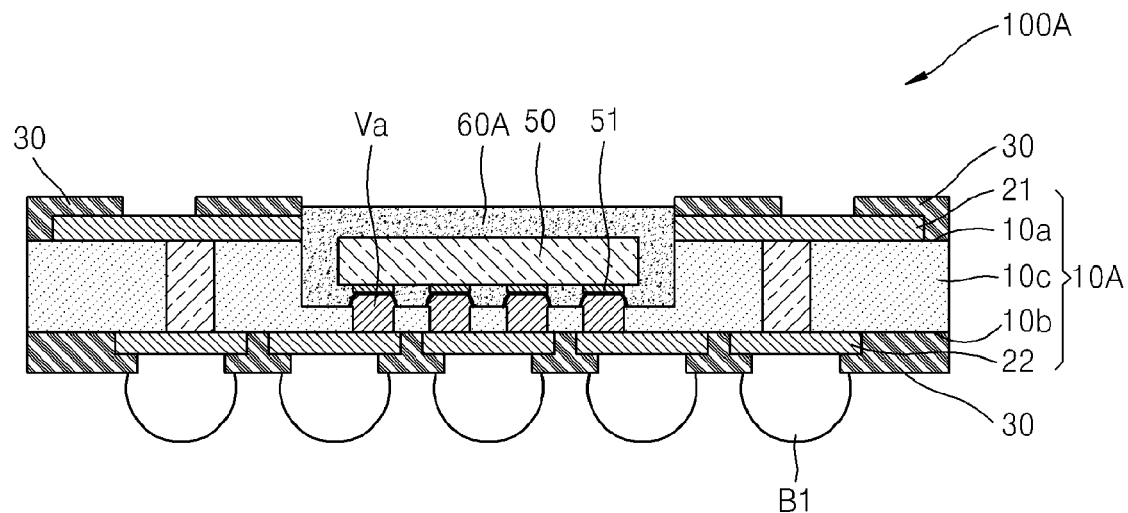
FIG. 1D is a further cross-sectional view of the one embodiment of a chip package and a method of manufacturing the same according to the present invention.

Referring to FIG. 1D, the semiconductor chip 50 is mounted to the substrate 10A within the cavity CV. Examples of the semiconductor chip 50 include a volatile memory device such as a dynamic random access memory (DRAM) and a static random access memory (SRAM), a non-volatile memory device such as a flash memory, an optoelectronic device, a logic device, an RF device, a digital signal processor and a system-on-chip (SoC). The semiconductor chip 50 is mounted in a flip-chip manner. That is, the contact pads 51 of the semiconductor chip 50 are directed towards the bottom of the cavity CV, and are then bonded to the via conductors Va. In some embodiments, conductive bumps such as solder balls are interposed between the contact pads 51 of the semiconductor chip 50 and the via conductors Va.

The electrical connection between the semiconductor chip 50 and the via conductors Va is then protected. For example, the area between the semiconductor chip 50 and the bottom of the cavity CV may be filled with material by an underfill process that uses capillary action to induce the material into such a small space, which filling process is well known in the art per se. In addition, a liquid film formed of a resin-based material may be pre-inserted in the cavity CV so as to become interposed between the semiconductor chip 50 and the surface defining the bottom of the cavity CV, and then a hot pressing process or a reflow process may be performed while the semiconductor chip 50 is disposed within the cavity CV. During the hot pressing and/or the reflow process, the liquid film is cured, and thus thermal and/or mechanical stresses applied to the semiconductor chip 50 and the via conductors Va is alleviated. In the embodiment shown in FIG. 1D, the region of the cavity CV not occupied by the semiconductor chip 50 is filled by a thermosetting resin such as an epoxy mold compound (EMC) to form a molded member 60A that fills the cavity CV.

Conductive bumps B1, for example, solder balls or stud bumps, are formed on the second interconnection pattern 22 of the substrate 10A in order to bond the chip package 100A to an external circuit such as a mother board or another chip package. The conductive bumps B1 may be arranged in a grid. In this case, the package is a ball grid array (BGA) package.

Finally, a method of making a semiconductor package according to the present invention has been described above as a series of steps in a given sequence as illustrated in FIGS. 1A-1D. However, the method is not limited by the particular sequence of the steps so described.

Another chip package and its method of manufacture, according to the present invention, will now be described with reference to FIGS. 2A through 2C.

Figure 2A:
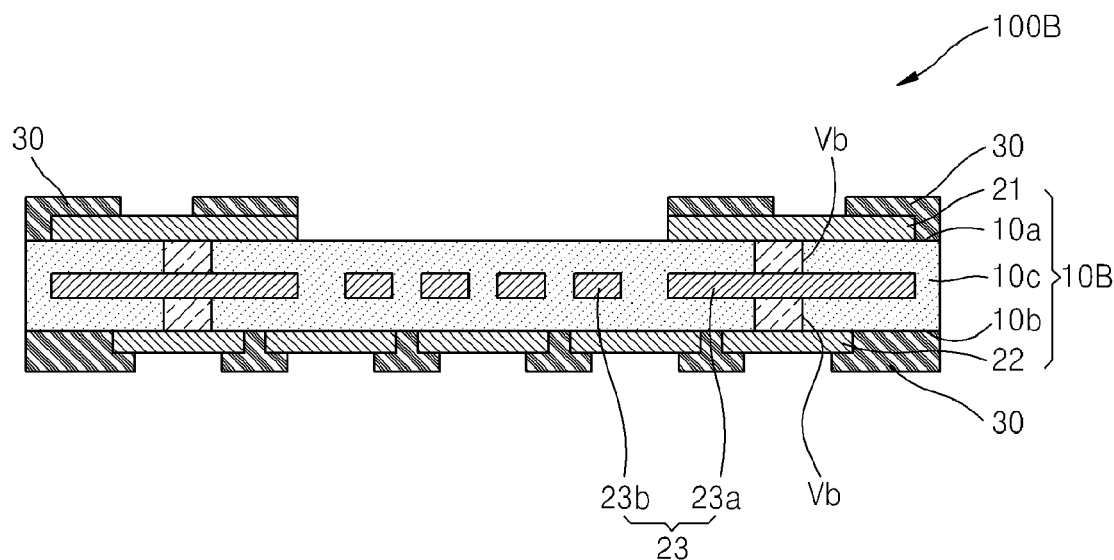
FIG. 2A is a cross-sectional view of a substrate and illustrate another embodiment of a chip package and a method of manufacturing the same according to the present invention.

Referring to FIG. 2A, the chip package 100B has a substrate 10B including first, second and third interconnection patterns 21, 22 and 23, and a semiconductor chip 50 (FIG. 2C) mounted to the substrate 10B. The third interconnection pattern 23 has an inner interconnection layer pattern 23a by which the first interconnection pattern 21 and the second interconnection pattern 22 are electrically connected to each other. More specifically, via conductors Vb electrically connect the inner interconnection layer pattern 23a and the first interconnection pattern 21 and electrically connect the inner interconnection layer pattern 23a and the second interconnection patterns 22 so that the first interconnection pattern 21 and the second interconnection pattern 22 are electrically connected to each other. The inner interconnection layer pattern 23a serves to redistribute electrical signals between the semiconductor chip 50 and an external circuit connected to the package via the first interconnection pattern 21 or the second interconnection pattern 22.

The via conductors Vb may be stacked vias as shown in FIG. 2A, i.e., the vias Vb that electrically connect the inner interconnection layer pattern 23a and the first interconnection pattern 21 are vertically aligned with the vias Vb that electrically connect the inner interconnection layer pattern 23a and the second interconnection pattern 22. Although not illustrated, the via conductors Vb may alternatively be staggered vias (the vias Vb that electrically connect the inner interconnection layer pattern 23a and the first interconnection pattern 21 are horizontally offset from the vias Vb that electrically connect the inner interconnection layer pattern 23a and the second interconnection patterns 22).

The third interconnection pattern 23 also has a layer of inner contacts 23b bonded to contact pads 51 of the semiconductor chip 50 (see FIG. 2C), as will be described later. The inner contacts 23b and the inner interconnection pattern section 23a may be formed on the same level as shown in the figures. It will be understood by one of ordinary skill in the art based on the description above that the substrate 10B may be a high density interconnection (HDI) board such as a multiple layer printed circuit board (PCB) having four or more layers.

Figure 2B:
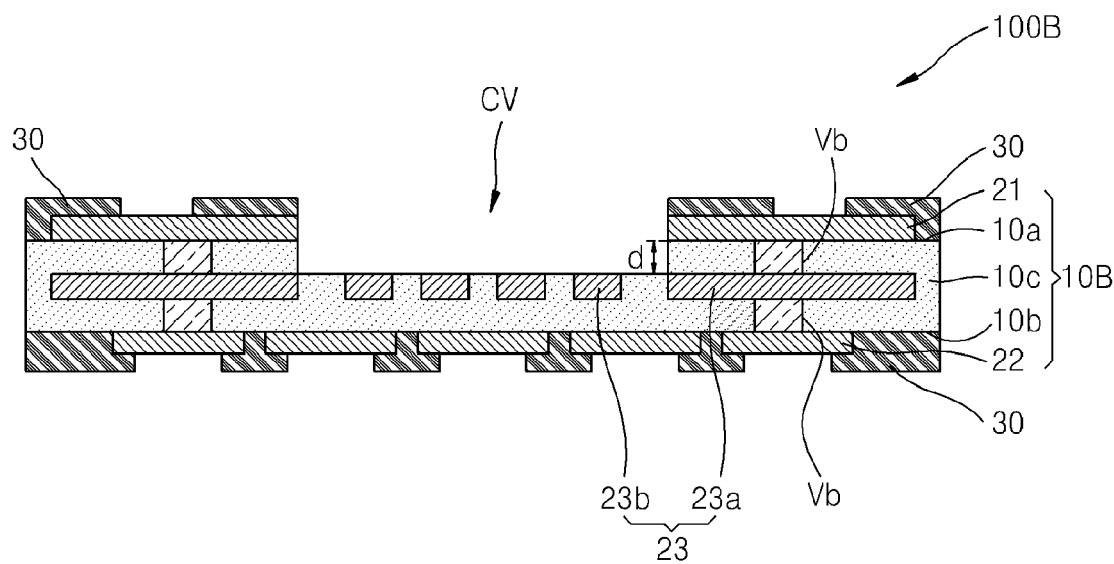
FIG. 2B is a further cross-sectional view of the another embodiment of a chip package and a method of manufacturing the same according to the present invention.

Referring to FIG. 2B, similar to the embodiment of FIGS. 1A-1D, the substrate body 10c has a cavity CV in an upper portion thereof. The cavity CV may be formed in the substrate body 10c by, for example, a dry etching, wet etching, screen printing, mechanical drilling or laser drilling process. An upper surface of the layer of inner contacts 23b is completely exposed at the bottom of the cavity CV. Alternatively, though, the bottom of the cavity CV may be located above the upper surface of the layer of inner contacts 23b. In this case, holes for exposing the upper surface of the inner contacts 23b may be formed. Each of the holes will extend between the bottom of the cavity CV and a respective one of the inner contacts 23b.

Figure 2C:
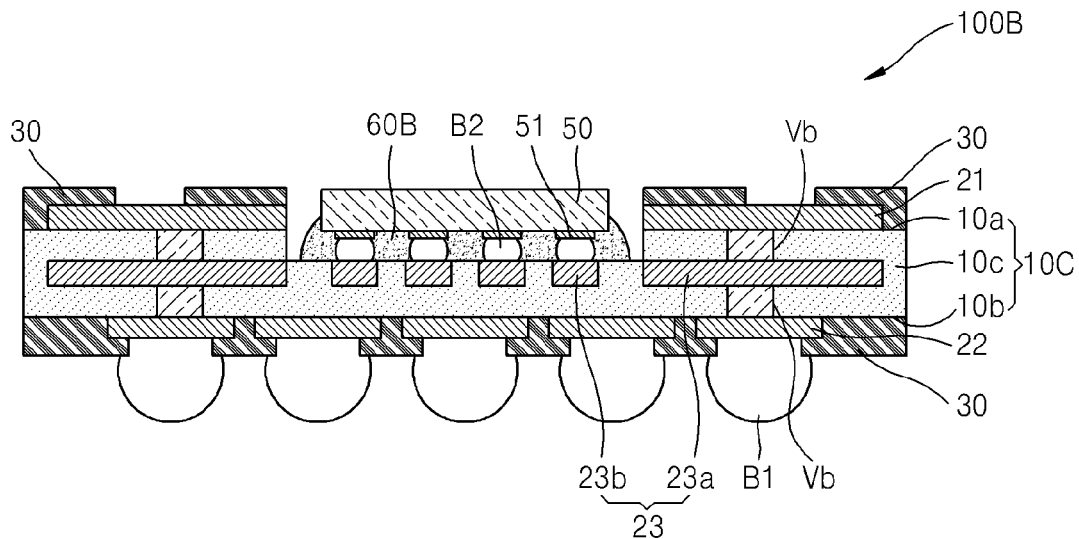
FIG. 2C is a further cross-sectional view of the another embodiment of a chip package and a method of manufacturing the same according to the present invention.

Referring to FIG. 2C, the semiconductor chip 50 is mounted to the substrate 10B within the cavity CV. In the present embodiment, the semiconductor chip 50 is mounted to the substrate 10B in a flip-chip manner in which the contact pads 51 of the semiconductor chip 50 are directed towards the bottom of the cavity CV, and then the contact pads 51 of the semiconductor chip 50 are bonded to the inner contacts by conductive bumps B2 such as solder balls or stud bumps.

The electrical connection between the semiconductor chip 50 and the inner contact pattern layers 23b is then protected. For example, a molding member 60B is formed in the cavity CV between the semiconductor chip 50 and the substrate body 10 using an underfill process, as described above. A liquid film may be used to form the molding member 60B. Alternatively, the semiconductor chip 50 may be completely embedded in an epoxy molding compound (EMC), as described with reference to FIG. 1D.

Conductive bumps B1, e.g., solder balls or stud bumps, are formed on the second interconnection pattern 22 to allow the chip package 100B to be bonded to an external circuit (not shown). The conductive bumps B1 may be arranged in a grid. In this case, the package is thus a ball grid array (BGA) package.

Another semiconductor chip package and a method of manufacturing the same, according to the present invention, will be described with reference to FIGS. 3A through 3C.

Figure 3A:
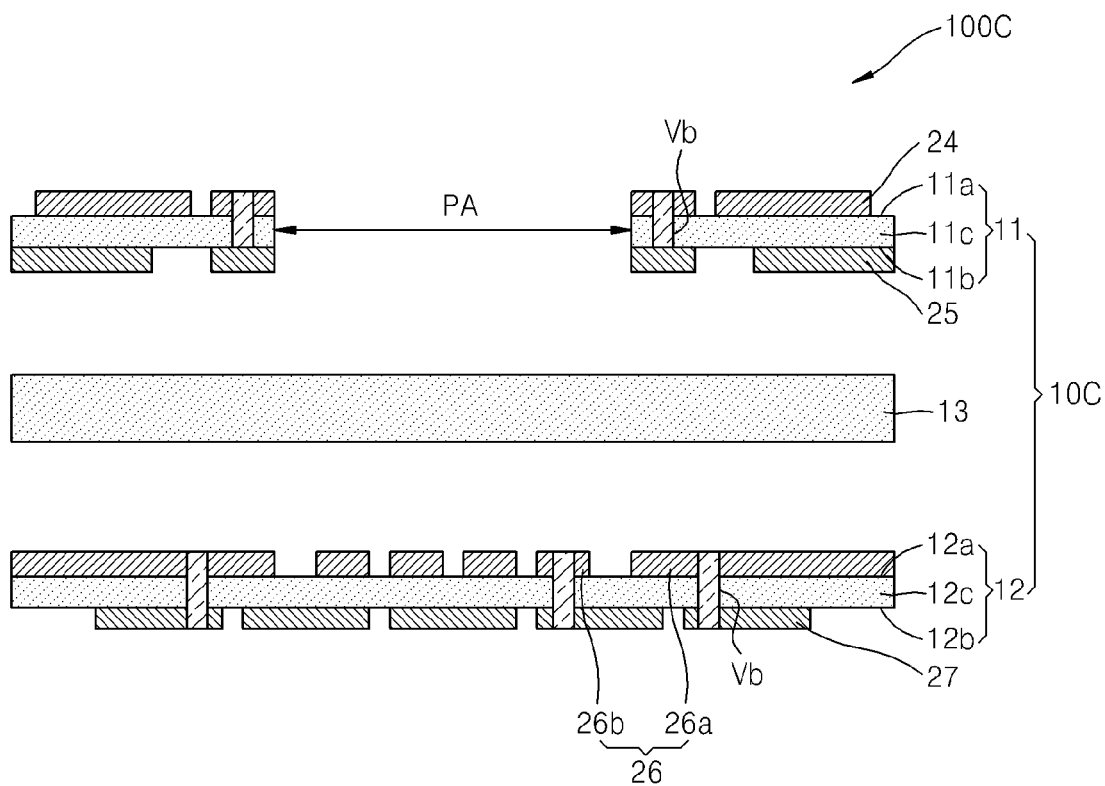
FIG. 3A is a cross-sectional view of a substrate and illustrate yet another embodiment of a chip package and a method of manufacturing the same according to the present invention.

Referring to FIG. 3A, the package 100C includes a substrate 10C and a semiconductor chip 50 (FIG. 3C) mounted to the substrate 10C. The substrate 10C, in turn, includes first and second prefabricated sub-substrates 11 and 12 coupled by an adhesive interlayer 13. The first sub-substrate 11 has at least one punched area (PA) or routed area. The punched area PA provides a cavity CV in which the semiconductor chip 50 (see FIG. 3C) is to be received, as will be described later. Thus, the shape and size of the punched area PA may be designed according to the shape, size and type of semiconductor chip 50 or according to the process of forming a molding member. For example, the profile of the punched area PA in plan may be square or circular, and the sidewalls which define the sides of the punched area PA may be vertical (perpendicular to the plane of the sub-substrate 11), inclined (such that the punched area tapers towards the adhesive interlayer 13) or stepped (such that cross section of the punched area decreases towards the adhesive interlayer 13).

The punched area PA may be formed by machining the body 11c of the sub-substrate 11 using a drill bit or a laser. Although not illustrated, the first sub-substrate 11 may be a unit sub-substrate produced from a wide carrier substrate. That is, a plurality of first sub-substrates 11 may be produced by dividing a wide carrier substrate into separate sub-substrates. In this case, punched areas PA may be formed in the wide carrier substrate before the wide carrier substrate is divided. In addition, a plurality of carrier substrates may be stacked, and then the stack may be drilled mechanically or using a laser in order to form a through-hole in the stack constituting the punched areas PA. In this way, a large number of sub-substrates can be efficiently produced.

The first sub-substrate 11 includes an interconnection pattern on at least one of a first main surface 11a and a second main surface 11b thereof. In the present embodiment, the first sub-substrate 11 includes first and second interconnection patterns 24 and 25 on the first and second main surfaces 11a and 11b, respectively. Also, via conductors Vb extending through the body 11c of the first sub-substrate 11 electrically interconnect at least part of the first interconnection pattern 24 formed on the first main surface 11a and at part of the second interconnection pattern 25 formed on the second main surface 11b.

The second sub-substrate 12 has a third interconnection pattern 26 formed on a first main surface 12a thereof and a second interconnection pattern 27 formed on the second main surface 12b thereof. The third interconnection pattern 26 includes an inner interconnection layer pattern 26a and/or inner contacts 26b. The inner interconnection pattern layers 26a may serve to redistribute electrical signals between an external circuit connected to the first sub-substrate 11 and another external circuit connected to the second sub-substrate 12. The inner interconnection layer pattern 26a and the inner contacts may be formed on the same level. Parts of each of the first and second interconnection patterns 26 and 27 may be electrically connected by via conductors Vb.

The adhesive interlayer 13 interposed between the first sub-substrate 11 and the second sub-substrate 12 may be formed of a resin-based material. For example, the adhesive interlayer 13 may be formed of phenolic cotton paper (FR-2), cotton paper and epoxy (FR-3), woven glass and epoxy (FR-4), woven glass and epoxy (FR-5), matte glass and polyester (FR-6), woven glass and epoxy (G-10), cotton paper and epoxy (CEM-1), cotton paper and epoxy (CEM-2), woven glass and epoxy (CEM-3), woven glass and epoxy (CEM-4), woven glass and polyester (CEM-5), or the like, which are prepreg materials known in the art. However, the adhesive interlayer 13 is not limited thereto, and may be formed of other adhesive materials having suitable applicability for the processes to be described later. For example, the adhesive interlayer 13 may be a photosensitive resin layer more commonly used in the art of photolithography. In addition, the adhesive interlayer 13 may be provided in liquid, a sheet, film, or paste form.

Figure 3B:
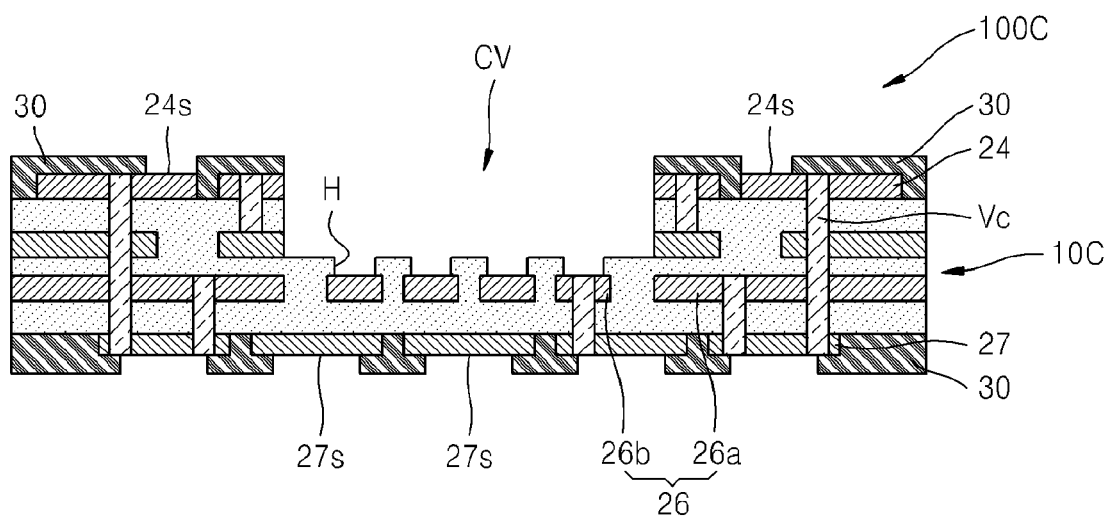
FIG. 3B is a further cross-sectional view of the yet another embodiment of a chip package and a method of manufacturing the same according to the present invention.

Referring to FIGS. 3A and 3B, the first sub-substrate 11 and the second sub-substrate 12 are vertically aligned with each other, the adhesive interlayer 13 may be disposed between the first sub-substrate 11 and the second sub-substrate 12, and then the first sub-substrate 11 and the second sub-substrate 12 are pressed together to attach them to one another through the intermediary of the adhesive interlayer 13. When the adhesive interlayer 13 is formed of a prepreg material, the first and second sub-substrates 11 and 12 may be attached during a B-stage of the curing process for the prepreg material. Then, the first and second sub-substrates 11 and 12 become strongly coupled to each other during a C-stage in which the prepreg material is completely cured.

When the first and second sub-substrates 11 and 12 are coupled to each other, the cavity CV may be defined by the punched area PA of the first sub-substrate 11 and a surface of the adhesive interlayer 13 exposed in the punched area PA. Holes h may be formed through the exposed part of the adhesive interlayer 13 by a dry etching, wet etching, or screen printing process but preferably by drilling through the adhesive interlayer 13 with a mechanical bit or a laser. As a result, at least some of the inner contact patterns 26b of the second sub-substrate 12 are exposed by the holes h. When the adhesive interlayer 13 is formed of a photosensitive resin material, the holes h may be formed by photolithography. Although not illustrated, via conductors may be formed in the holes h of the adhesive interlayer 13 so as to be electrically connected to the inner contacts 26b, as described with reference to and illustrated in FIG. 1C.

Through hole via conductors Vc are formed through the first sub-substrate 11 and the second sub-substrate 12 to provide an electrical connection between the first sub-substrate 11 and the second sub-substrate 12. The through hole via conductors Vc may be formed of aluminum (Al), copper (Cu) or an alloy thereof.

Subsequently, a passivation layer 30 is formed on the substrate 10C. The passivation layer 30 exposes regions 24s and 27s of the first and second interconnection patterns 24 and 27. The regions 24s and 27s serve as package contact regions where the chip package 100C can be electrically connected to an external circuit. For instance, conductive bumps B1 such as solder balls are formed on the exposed regions 27s of the second interconnection patterns 27 of the substrate 10C.

Figure 3C:
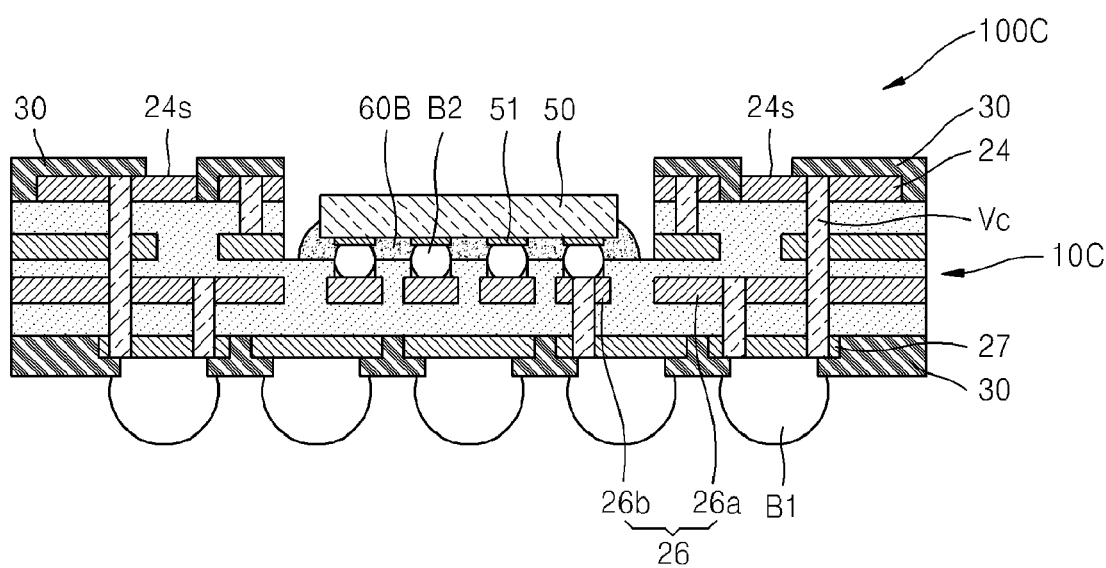
FIG. 3C is a further cross-sectional view of the yet another embodiment of a chip package and a method of manufacturing the same according to the present invention.

Then, referring to FIG. 3C, the semiconductor chip 50 is mounted in the cavity CV. More specifically, the semiconductor chip 50 is mounted using a flip-chip technique. In this technique, contact pads 51 of the semiconductor chip 50 are bonded to the inner contacts by conductive bumps B2 such as solder balls or stud bumps. Although not illustrated, via conductors may be formed on the inner contacts, and the contact pads 51 of the semiconductor chip 50 may be bonded directly to the via conductors.

A molding member 60B may be formed in the cavity CV between the semiconductor chip 50 and the adhesive layer 13 using an underfill process, as described above in connection with the previous embodiments, to protect the electrical connection between the semiconductor chip 50 and the substrate 10C. The molding member 60B can be formed using a liquid film, as also described above. In addition, the semiconductor chip 50 may be completely embedded in an epoxy mold compound (EMC), again as described above.

Another embodiment of a chip package and a method of manufacturing the same, according to the present invention, will now be described with reference to FIGS. 4A through 4E.

This chip package 100D includes a substrate 10D, and upper and lower semiconductor chips 50 and 70 mounted to the substrate 10D. Hereinafter, the upper and lower semiconductor chips 50 and 70 will be referred to as a first semiconductor chip 50 and a second semiconductor chip 70, respectively.

Figure 4A:
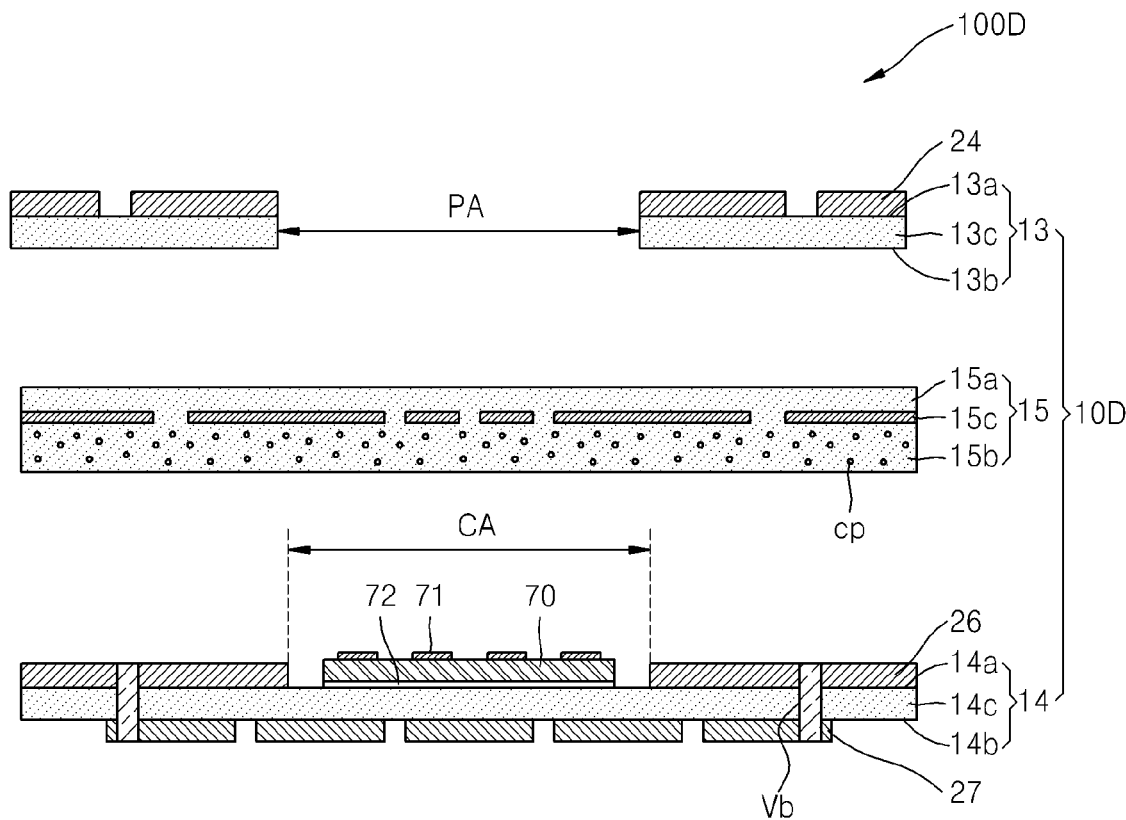
FIG. 4A is a cross-sectional view of a substrate and illustrate still another embodiment of a chip package and a method of manufacturing the same according to the present invention.

Referring to FIG. 4A, the substrate 10D includes first and second sub-substrates 13 and 14 bonded together by an adhesive interlayer 15. The first sub-substrate 13 has at least one punched area PA. As described above, the punched area PA may be formed by a mechanical machining or laser drilling process or the like.

The first sub-substrate 13 also includes a first interconnection pattern 24 formed on a first main surface 13a of the body 13c thereof. The first sub-substrate 13 may include a second interconnection pattern 25 formed on a second main surface 13b of the body 13c, as illustrated in FIG. 3A. In this case, at least some of the first and second interconnection patterns 24 and 25 may be electrically connected to each other by via conductors.

The second sub-substrate 14 includes interconnection patterns 26 and 27 formed on a first main surface 14a and a second main surface 14b of the body 14c thereof, respectively. At least portions of the first interconnection pattern 26 and the second interconnection pattern 27 are electrically connected by via conductors Vb.

In addition, the second sub-substrate 14 has a chip attach region CA. The second semiconductor chip 70 is disposed within the chip attach region CA and mounted to the body 14c of the sub-substrate 14 with contact pads 71 of the second semiconductor chip 70 directed away from the sub-substrate 14. To this end, a bonding layer 72 is interposed between a bottom surface of the second semiconductor chip 70 and the body 14c of the sub-substrate 14 to bond the chip 70 to the sub-substrate 14. The bonding layer 72 may be conductive metal paste, insulating rein epoxy, or an insulating tape. The bonding layer 72 may be a conductive bonding layer if the bottom surface of the semiconductor chip 70 comprises an electrode.

The adhesive interlayer 15 that couples the first sub-substrate 13 and the second sub-substrate 14 includes first and second insulating layers 15a and 15b providing an adhesive insulating surface, and an inner interconnection pattern 15c interposed between the first and second insulating layers 15a and 15b. The first and second insulating layers 15a and 15b may be formed of a resin-based material. The first and second insulating layers 15a and 15b may be formed of a prepreg material. The first and second insulating layers 15a and 15b may be photosensitive resin layers on which photolithography can be performed. In addition, the first and second insulating layers 15a and 15b may be provided in liquid, sheet, film, or paste form.

In addition, the first and second insulating layers 15a and 15b may each be an anisotropic conductive film (ACF) that is well known in the art per se. In the embodiment shown in FIG. 4A, the second insulating layer 15b is an ACF. Conductive particles cp dispersed in the ACF provide a conductive path between the inner interconnection pattern 15c interposed between the first and second insulating layers 15a and 15b, and the contact pads 71 of the second semiconductor chip 70. Alternatively, the electrical connection between the first semiconductor chip 50 and the second semiconductor chip 70 can be provided by only the ACF, i.e., without the inner interconnection pattern 15c.

Figure 4B:
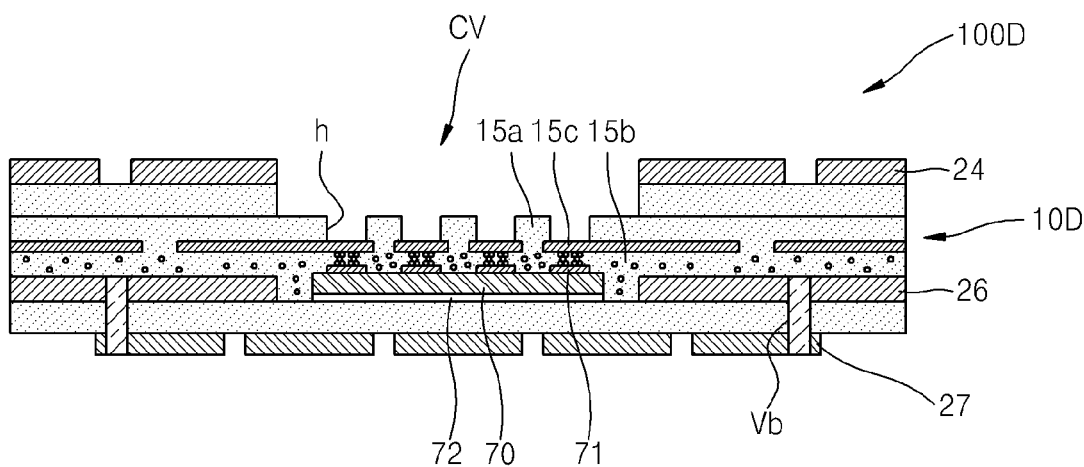
FIG. 4B is a further cross-sectional view of the still another embodiment of a chip package and a method of manufacturing the same according to the present invention.

Referring to FIGS. 4A and 4B, the adhesive interlayer 15 is interposed between the first sub-substrate 13 and the second sub-substrate 14, and the first sub-substrate 13 and the second sub-substrate 14 are aligned with each other. Then, the first sub-substrate 13 and the second sub-substrate 14 are pressed together so that the first sub-substrate 13 and the second sub-substrate 14 are fixed together by the adhesive interlayer 15.

When the adhesive interlayer 15 includes a prepreg material, the first sub-substrate 13 and the second sub-substrate 14 are pressed together during a B-stage of the curing process of the prepreg material. The first sub-substrate 13 and the second sub-substrate 14 become strongly coupled to each other during a C-stage of the curing process in which the prepreg material of the adhesive interlayer 15 may is completely cured. If the second insulating layer 15b is an ACF, stress is applied to the conductive particles cp dispersed in the ACF when the first sub-substrate 13 and the second sub-substrate 14 are pressed together. The stress helps to form a conductive path between the inner interconnection pattern 15c of the adhesive interlayer 15 and the second semiconductor chip 70.

However, another means and method may be used to electrically connect the inner interconnection pattern 15c of the adhesive interlayer 15 and the contact pads 71 of the second semiconductor chip 70. For example, the inner interconnection pattern 15c of the adhesive interlayer 15 and the contact pads 71 of the second semiconductor chip 70 may be connected by conductive bumps such as solder balls or stud bumps. In this case, a thermosetting resin may be injected using a syringe between the inner interconnection pattern 15c and the second semiconductor chip 70. The space between the second sub-substrate 14 and the inner interconnection pattern 15c is filled by the thermosetting resin through a capillary action, and then the resin is cured. The cured thermosetting resin may constitute the second insulating layer 15b of the adhesive interlayer 15.

When the first sub-substrate 13 and the second sub-substrate 14 are coupled to each other, a cavity CV in which the first semiconductor chip 50 is to be mounted is defined by the punched area PA of the first sub-substrate 13 and a surface of the adhesive interlayer 15, which is exposed in the punched area PA. A surface of the inner interconnection pattern 15c is exposed by performing a dry etching, wet etching, or screen printing process on the exposed surface of the adhesive interlayer 15, or preferably by drilling the surface of the adhesive interlayer 15 exposed at the bottom of the cavity CV with a mechanical bit or with a laser. When the adhesive interlayer 15 is formed of a photosensitive resin material, the upper surface of the inner interconnection pattern 15c may be exposed using a photolithographic process in which the photosensitive resin is exposed to light of a given wavelength and then developed. In the present embodiment, one of these processes is used to form holes h in the adhesive interlayer 15. In this case, conductive material (described later) is provided in the holes h to form via conductors electrically connected to the inner interconnection pattern 15c.

Figure 4C:
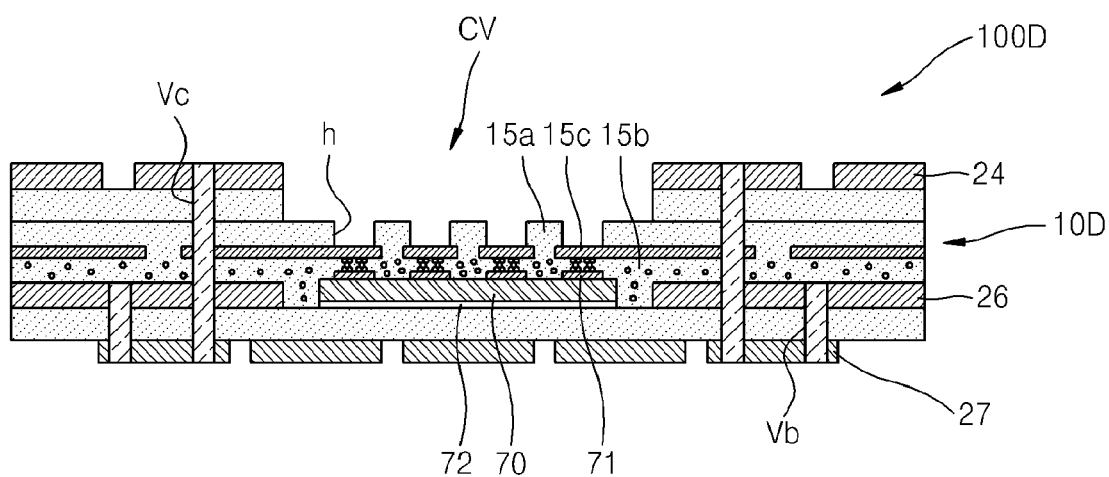
FIG. 4C is a further cross-sectional view of the still another embodiment of a chip package and a method of manufacturing the same according to the present invention.

As illustrated in FIG. 4C, through hole via conductors Vc are formed through the first sub-substrate 13 and the second sub-substrate 14 to electrically connect the first sub-substrate 13 and the second sub-substrate 14 which are stacked. More specifically, the though hole via conductors Vc provide electrical connections between the interconnection patterns 24, 26 and 27 of the first and second sub-substrates 13 and 14.

Figure 4D:
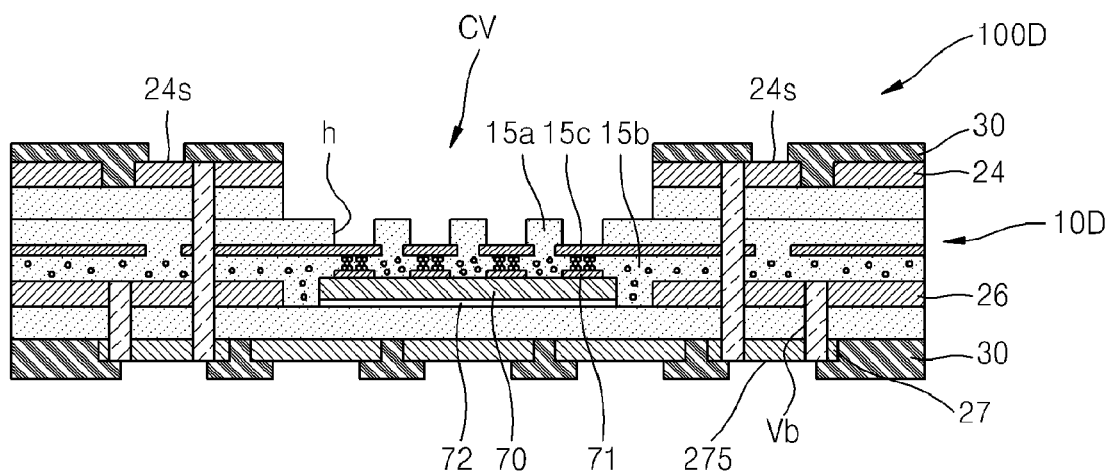
FIG. 4D is a further cross-sectional view of the still another embodiment of a chip package and a method of manufacturing the same according to the present invention.

Referring to FIG. 4D, a passivation layer 30 is formed on each of the sub-substrates 13 and 14 after the through hole via conductors Vc are formed. The passivation layers 30 expose portions 24s and 27s of the first and second interconnection patterns 24 and 27. The exposed portions 24s and 27s of the first and second interconnection patterns 24 and 27 are regions at which the chip package 100D can be electrically connected to an external circuit such as that of another chip package or a mother board. Conductive bumps B1 such as solder balls or stud bumps are formed on the exposed region 27s of the second interconnection pattern 27 of the substrate 10D, as shown in FIG. 4E.

Figure 4E:
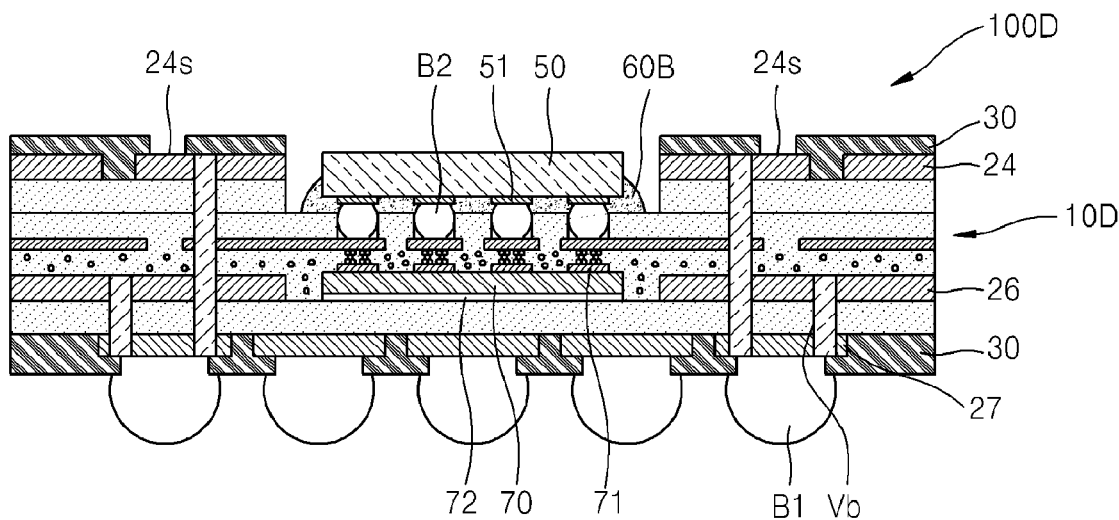
FIG. 4E is a further cross-sectional view of the still another embodiment of a chip package and a method of manufacturing the same according to the present invention.

Referring further to FIG. 4E, the first semiconductor chip is mounted in the cavity CV in a flip-chip manner. That is, contact pads 51 of the first semiconductor chip 50 are bonded to the inner contacts 15c through conductive bumps B2 such as solder balls or stud bumps. Although not illustrated, the contact pads 51 of the first semiconductor chip 50 may be bonded to via conductors (mentioned above) that are formed within the holes h as electrically connected to the inner contacts 15c.

Next, an underfill process using a liquid film can be performed to protect the electrical connection between the first semiconductor chip 50 and the substrate 10D. In the underfill process, space in the cavity CV between the bottom of the first semiconductor chip 50 and the adhesive layer 15 can be filled by a resin-based material such as epoxy or the like. Thus, a molding member 60B is formed. Alternatively, the first semiconductor chip 50 may be completely encapsulated in the cavity CV by an epoxy mold compound (EMC).

The embodiment shown in FIG. 4E is a chip on chip (COC) type of stacked chip package in which the first semiconductor chip 50 is stacked on the second semiconductor chip 70. And, although a method of fabricating the COC package has been described with respect to a particular sequence of steps, one of ordinary skill in the art will readily appreciate that the sequence may vary from that described above. For example, the through hole via conductors Vc may be formed, the passivation layer 30 may be formed, and then the holes h may be formed in the first insulating layer 15a.

According to the above embodiments described with reference to FIGS. 1A through 4E, a semiconductor chip is situated within a cavity of a substrate where it is embedded, and is oriented in a flip-chip manner. In this respect, the cavity may accommodate the semiconductor chip in its entirety. Therefore, a complicated interconnection structure is not required, the interconnection density can be great, and the device can operate at a high speed device due to reduced signal inductance. In addition, the chip package can be remarkably thin.

Next, various stacked packages according to the present invention will be described. The stacked packages include at least one of the chip packages described above.

Figure 5:
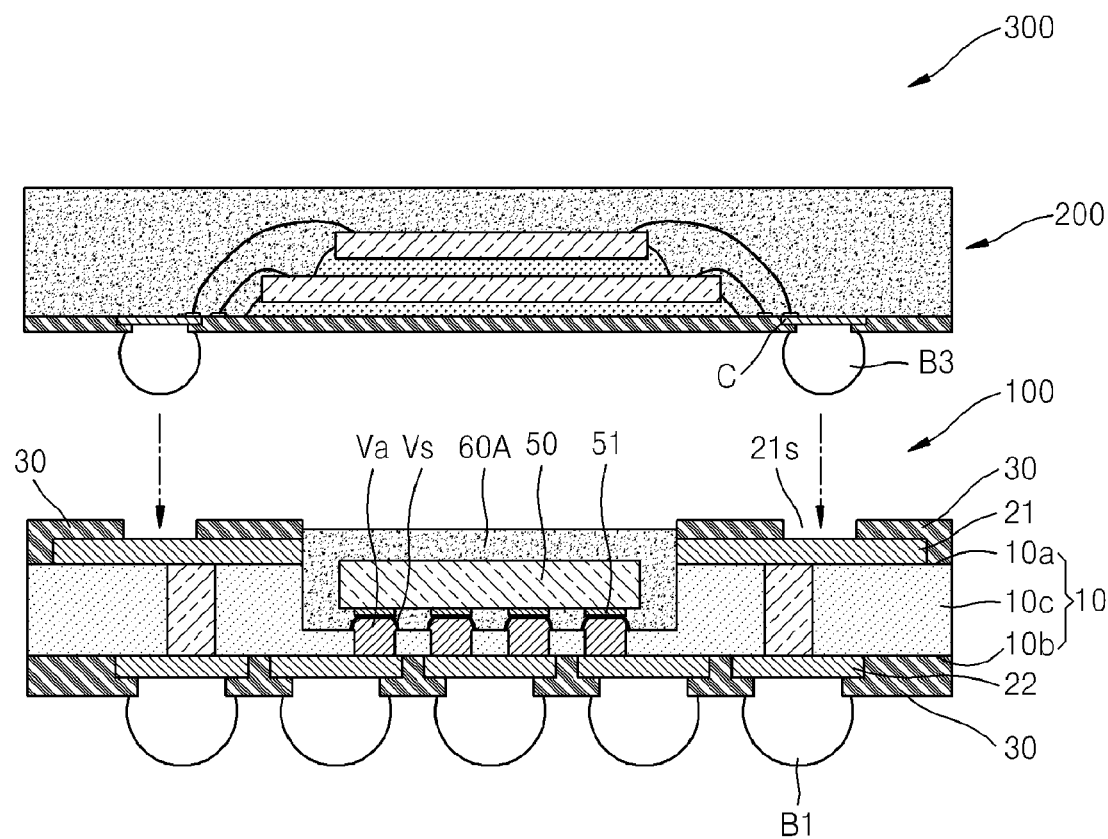
FIG. 5 is a cross-sectional and exploded view of one embodiment of a stacked package according to the present invention.

Referring to FIG. 5, a stacked package 300 according to the present invention includes a lower chip package 100 and an upper package 200 stacked on the lower chip package 100. That is, the stacked package 300 has a package on package (POP) structure.

The lower chip package 100 may be the same as the chip package 100A illustrated in FIG. 1D and so, a description thereof will be omitted for the sake of brevity. However, it will be understood any of the chip packages described with reference to FIGS. 2C, 3C and 4E may be used as the lower chip package. The upper package 200 may be bonded to the lower chip package 100 through conductive bumps B3 such as solder balls or stud bumps.

The conductive bumps B3 are formed on contact regions c of the upper package 200, the conductive bumps B3 are aligned with the exposed regions 21s of the first interconnection pattern 21 of the lower chip package 100, and then the first interconnection pattern 21 and the conductive bumps B3 are pressed together and heated. As a result, the upper package 200 and the lower chip package 100 are bonded to each other. A reflow process may then be performed on the conductive bumps B3.

The upper package 200 may include a single semiconductor chip, or may include a chip module made up of a plurality of semiconductor chips electrically using a conventional wire bonding technique as is the case in the embodiment illustrated in FIG. 5. However, other known types of packages may be used as the upper package 200 according to the present invention.

Figure 6:
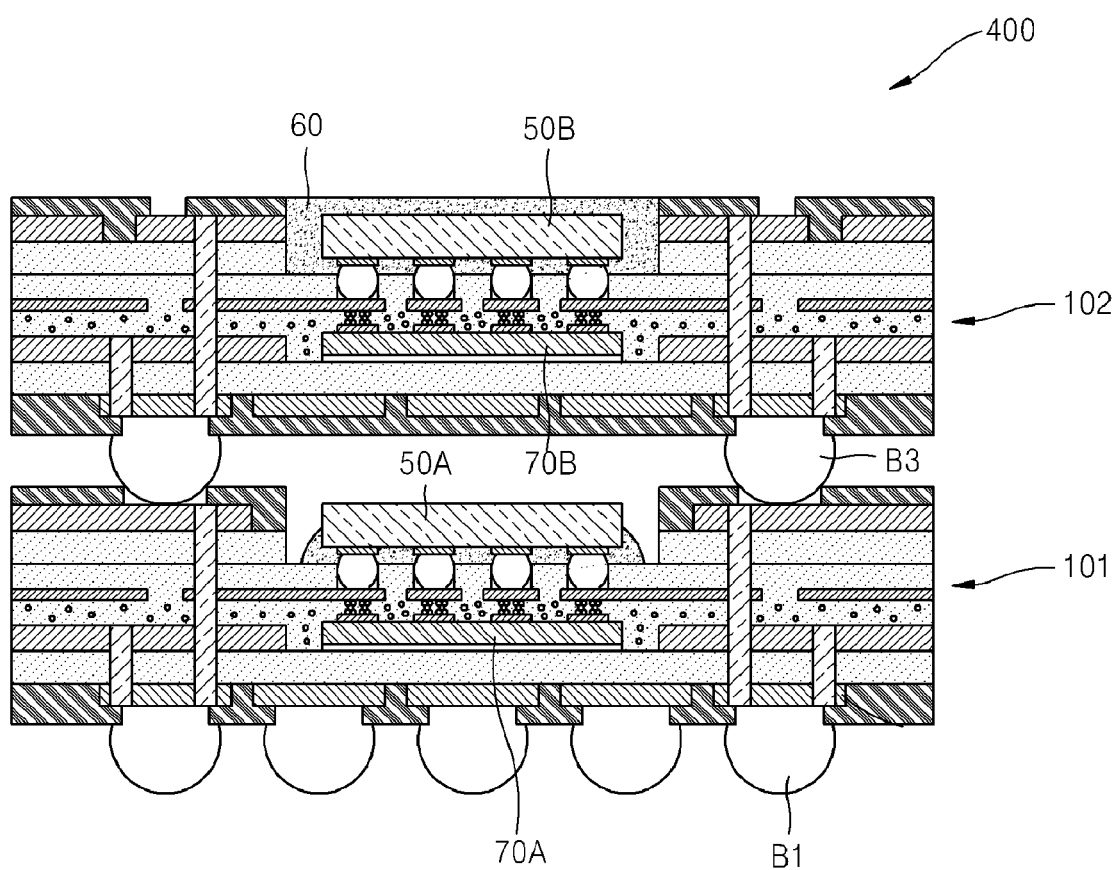
FIG. 6 is a cross-sectional view of another embodiment of a stacked package according to the present invention.

A stacked package 400 having a POP structure according to the present invention will now be described with reference to FIG. 6.

The stacked package 400 has a plurality of chip packages including a lower chip package 101 and an upper chip package 102. Both the lower chip package 101 and the upper chip package 102 may be the same as the chip package 100D illustrated in FIG. 4E. However, it will be readily understood by those of ordinary skill in the art that any of the chip packages described with reference to FIGS. 1D, 2C and 3C may be used as the lower chip package 101 and/or the upper chip package 102. In any case, the lower and upper chip packages 101 and 102 may each have a chip on chip (COC) structure in which a semiconductor chip 50A, 50B mounted in a flip-chip manner is stacked on an embedded semiconductor chip 70A, 70B.

In the upper chip package 102, semiconductor chip 50B may be encapsulated (completely sealed) by a molding member 60 in order to protect the semiconductor chip 50B. Although two chip packages are stacked in the embodiment illustrated in FIG. 6, the present invention is not limited thereto. That is, the package 400 may have three or more stacked chip packages. Also, a conventional chip package may be disposed between the lower and upper chip packages 101 and 102.

According to the present invention as described above, a semiconductor chip package is relatively thin because a chip thereof is partly or wholly received in a cavity in a substrate of the package. Accordingly, stacked packages including such a chip package are also relatively thin. In addition, the chip has a flip chip orientation. Pad contacts of the chip are electrically conductively bonded to an internal or external interconnection pattern using conductors such as vias or solder bumps or studs. Thus, electrical interconnections are made without a wire bonding process. Accordingly, the electrical connections are reliable, and the semiconductor chip package can operate at a high speed with a high degree of reliability.

Finally, although the present invention has been described with reference to the preferred embodiments thereof, the present invention may be embodied in other ways. Therefore, it is to be understood that the foregoing description is illustrative of the present invention and that the present invention is not limited to the specific embodiments disclosed. Rather, other embodiments and modifications of the disclosed embodiments may fall within the true spirit and scope of the invention as defined by the appended claims.

What is claimed is:

1. A semiconductor chip package comprising:
a substrate comprising a unitary substrate body having a first main surface, a second main surface, a cavity that defines an opening in the first main surface, and holes extending from the bottom of the cavity to the second main surface,
a first interconnection pattern of conductive material integral with the substrate body and extending along the first main surface of the substrate body;

a second interconnection pattern of conductive material integral with the substrate body and extending along the second main surface of the substrate body, wherein the holes of the substrate body open at portions of the second interconnection pattern;

via conductors extending through the substrate body from the first interconnection pattern to the second interconnection pattern so as to electrically connect the first and second interconnection patterns;

electrically conductive vias respectively disposed in the holes at the bottom of the cavity in the substrate body and contacting said portions of the second interconnection pattern;

a semiconductor chip disposed within the cavity and mounted to the substrate, the chip having electrical contacts in the form of pads, the pads facing in a direction towards the bottom of the cavity such that the chip has a flip-chip orientation with respect to the substrate, and the pads being electrically conductively bonded to the vias so as to be electrically connected by the vias to said portions of the second interconnection pattern; and conductive bumps respectively bonded to the regions of the second interconnection pattern.

2. A stacked package comprising a first semiconductor chip package as claimed in claim 1, and a second semiconductor chip package, and a second set of conductive bumps bonded to the first interconnection pattern of the first semiconductor chip package and to the second semiconductor chip package and thereby electrically conductively connecting the semiconductor chip packages to each other.

3. A stacked package comprising a first semiconductor chip package as claimed in claim 1, and a second semiconductor chip package, and conductive bumps bonding and electrically conductively connecting the semiconductor chip packages to each other.

4. The chip package of claim 1, further comprising a passivation layer extending over the second main surface of the body of the substrate and exposing regions of the second interconnection pattern, and wherein the conductive bumps are bonded to the regions of the second interconnection pattern exposed by the passivation layer.

5. A semiconductor chip package comprising:
a substrate including a first sub-substrate, a second sub-substrate, and an adhesive interlayer coupling the first and second sub-substrates together; and
first and second semiconductor chips mounted to the substrate as stacked one above the other,
wherein the first sub-substrate comprises a substrate body having a first main surface, a second main surface, and a punched out area defining a through-hole extending between and open to the first and second main surfaces,
the second sub-substrate comprises a second substrate body having a first main surface facing the second main surface of the body of the first sub-substrate and a second main surface, and a layer of electrically conductive material extending along the second main surface of the second substrate body and having a pattern wherein the layer of electrically conductive material constitutes a first interconnection pattern of the substrate,
the adhesive interlayer is interposed between the first chip and the second chip, the adhesive layer defining the bottom of a cavity in the substrate and the punched-out area defining an upper portion of the cavity including an opening of the cavity in the first main surface of the first sub-substrate,
the first semiconductor chip is disposed within the cavity, the first semiconductor chip having electrical contacts facing in a direction towards the bottom of the cavity such that the first semiconductor chip has a flip-chip orientation with respect to the substrate, and the second semiconductor chip is mounted to the second sub-substrate independently of the adhesive layer, the second semiconductor chip having electrical contacts facing in a direction away from the second substrate body, and the electrical contacts of the first semiconductor chip being electrically conductively connected to the electrical contacts of the second semiconductor chip, and the electrical contacts of the second semiconductor chip being electrically conductively connected to the first interconnection pattern of the substrate.

6. The chip package of claim 5, wherein the adhesive interlayer comprises at least one of a layer of prepreg and a layer of photosensitive resin.

7. The chip package of claim 5, wherein the electrical contacts of the first semiconductor chip are in the form of pads, the second interconnection pattern comprises inner contacts, and
the adhesive interlayer comprises a first insulating layer having through-holes, and a second insulating layer comprising an anisotropic conductive film (ACF), and
further comprising electrically conductive material disposed in the through-holes and electrically conductively connected to the contact pads of the first semiconductor chip, and the contact pads of the first and second semiconductor chips being electrically conductively connected by the ACF and the electrically conductive material disposed in the through-holes of the first insulating layer of the adhesive interlayer.

8. A stacked package comprising a first semiconductor chip package as claimed in claim 5, and a second semiconductor chip package, and conductive bumps bonding and electrically conductively connecting the chip packages to each other.

9. The chip package of claim 5, wherein the second sub-substrate comprises a second layer of electrically conductive material, the second layer extending along the first main surface of the second substrate body and having a pattern wherein the second layer of electrically conductive constitutes a second interconnection pattern of the substrate,
the substrate has holes extending through into the adhesive interlayer at the bottom of the cavity, and
the electrical contacts of the first semiconductor chip are in the form of pads, and
further comprising electrically conductive material disposed in the holes and electrically conductively connecting the second interconnection pattern and the pads of the semiconductor chip.

10. The chip package of claim 9, wherein the first sub-substrate further comprises a third layer of electrically conductive material, the third layer extending along one of the main surfaces of the first substrate body and having a pattern wherein the third layer of electrically conductive constitutes a third interconnection pattern of the substrate, and further comprising
electrically conductive vias extending through the first sub-substrate and the second sub-substrate, and electrically conductively connecting the third interconnection pattern to at least one of the first and second interconnection patterns.

11. The chip package of claim 10, wherein the electrical contacts of the first semiconductor chip are in the form of pads, and the electrical contacts of the second semiconductor chip are in the form of pads, and
the pads of the second semiconductor chip face towards the pads of the first semiconductor chip, respectively, and the pads of the second semiconductor chip are electrically conductively connected to portions of the second interconnection pattern, respectively.

12. The chip package of claim 5, wherein the adhesive interlayer comprises first and second layers of electrical insulation, and a layer of electrically conductive material having a pattern and disposed between the first and second layers of electrical insulation so as to constitute an inner interconnection pattern of the adhesive interlayer, and at least one of the second interconnection pattern and the inner interconnection pattern of the adhesive layer is electrically conductively connected to the first interconnection pattern.

13. The chip package of claim 12, wherein at least one of the first and second layers of electrical insulation comprises an anisotropic conductive film (ACF).

14. A semiconductor chip package comprising:

a substrate comprising a substrate body having a first main surface, a second main surface, a cavity that defines an opening in the first main surface, and holes extending from the bottom of the cavity, an outer interconnection pattern of conductive material integral with the substrate body and extending along the second main surface of the substrate body, an inner interconnection pattern of conductive material interposed between the first and second main surfaces and comprising inner contacts to which the holes extend, respectively, and conductive vias electrically conductively connecting the inner interconnection pattern and the outer interconnection pattern to each other;

a semiconductor chip disposed within the cavity and mounted to the substrate, the chip having electrical contacts in the form of pads, the pads facing in a direction towards the holes extending from the bottom of the cavity in the substrate body such that the chip has a flip-chip orientation with respect to the substrate; and conductive bumps disposed in the holes, respectively, the conductive bumps bonding the pads of the semiconductor chip to the inner contacts.

15. The chip package of claim 14, wherein the conductive bumps are balls of solder.

16. The chip package of claim 14, further comprising:

a passivation layer extending over the second main surface of the body of the substrate and exposing regions of the outer interconnection pattern; and conductive bumps respectively disposed on the regions of the second interconnection pattern exposed by the passivation layer.

17. The chip package of claim 16, wherein the substrate further comprises an outer interconnection pattern of conductive material integral with the substrate body and extending along the first main surface thereof, and the conductive vias electrically conductively connect the outer interconnection patterns to each other.

18. A stacked package comprising a first semiconductor chip package as claimed in claim 17, a second semiconductor chip package, and conductive bumps bonding and electrically conductively connecting the second semiconductor chip package to the outer interconnection pattern of conductive material which extends along the first main surface of the substrate body of the first semiconductor chip package.

* * * * *